United States Patent
Mikkola et al.

(10) Patent No.: US 7,610,543 B2
(45) Date of Patent: Oct. 27, 2009

(54) METHOD AND APPARATUS FOR PUNCTURING WITH UNEQUAL ERROR PROTECTION IN A WIRELESS COMMUNICATION SYSTEM

(75) Inventors: Hannu Mikkola, Tampere (FI); Janne Vainio, Lempääiä (FI)

(73) Assignee: Nokia Corporation, Espoo (FI)

( * ) Notice: Subject to any disclaimer, the term of this patent is extended or adjusted under 35 U.S.C. 154(b) by 445 days.

(21) Appl. No.: 10/443,652

(22) Filed: May 21, 2003

(65) Prior Publication Data
US 2004/0039985 A1    Feb. 26, 2004

Related U.S. Application Data

(60) Provisional application No. 60/390,257, filed on Jun. 18, 2002.

(51) Int. Cl.
H03M 13/00    (2006.01)
H03M 13/03    (2006.01)

(52) U.S. Cl. .................... 714/774; 714/755; 714/790

(58) Field of Classification Search .......... 714/774, 714/790, 755
See application file for complete search history.

(56) References Cited

U.S. PATENT DOCUMENTS

| | | | |
|---|---|---|---|
| 5,668,820 A | * | 9/1997 | Ramesh et al. ............ 714/786 |
| 5,699,365 A | * | 12/1997 | Klayman et al. .......... 714/708 |
| 6,209,116 B1 | | 3/2001 | Hammons, Jr. et al. |
| 6,223,324 B1 | * | 4/2001 | Sinha et al. ............... 714/776 |
| 6,233,713 B1 | | 5/2001 | Van Den Berghe |

(Continued)

FOREIGN PATENT DOCUMENTS

EP    0 936 772    8/1999

(Continued)

OTHER PUBLICATIONS

3GPP TS 45.003, V5.7.0 (Apr. 2003); *3rd Generation Partnership Project; Technical Specification Group GSM/EDGE Radio Access Network; Channel coding (Release 5)*; Apr. 2003.

(Continued)

*Primary Examiner*—Joseph D Torres
(74) *Attorney, Agent, or Firm*—Ware, Fressola, Van Der Sluys & Adolphson, LLP

(57) ABSTRACT

A method and corresponding codec for (channel) encoding speech or other data bits for transmission via a wireless communication channel, the method providing unequal error protection (UEP) using only a single encoder, and including: a step of determining how many bits to puncture in each of typically two protection classes ($C_A$ $C_B$) so as to achieve either a predetermined or iterated desired level of error protection; and a step of identifying which bits to puncture for each class so as to provide relatively strong and uniform protection for all bits in the first class ($C_A$), but protection that decreases in the same manner as the subjective importance decreases from the beginning to the end of the other classes. The method also accounts for so-called soft puncturing by modulators transmitting multiple bits per symbol with weaker protection for some of the bits of each symbol.

25 Claims, 6 Drawing Sheets

U.S. PATENT DOCUMENTS

| | | | |
|---|---|---|---|
| 6,292,917 B1 * | 9/2001 | Sinha et al. | 714/752 |
| 6,311,306 B1 | 10/2001 | White et al. | |
| 6,405,338 B1 * | 6/2002 | Sinha et al. | 714/752 |
| 6,732,321 B2 * | 5/2004 | Classon et al. | 714/774 |
| 6,772,388 B2 * | 8/2004 | Cooper et al. | 714/774 |
| 2002/0015420 A1 | 2/2002 | Yoon et al. | |
| 2002/0066061 A1 | 5/2002 | Classon et al. | |

FOREIGN PATENT DOCUMENTS

| | | |
|---|---|---|
| EP | 1 041 756 | 10/2000 |

OTHER PUBLICATIONS

U.S. Appl. No. 10/040,885, filed Jan. 2, 2002, Method and System for Allocating Convolutional Encoded Bits Into Symbols Before Modulation for Wireless Communication; inventors: Hannu Mikkola, et al.

*Digital Communications*, Fourth Edition, John G. Proakis.

Frank Burkert et al:"Turbo decoding with unequal error protection applied to GSM speech coding" GLOBECOM. IEEE Global Telecommunications Conference and Exhibition, New York, NY, US, No. 3, Nov. 18, 1996, pp. 2044-2048.

$3^{rd}$ Generation Partnership Project; Technical Specification Group GSM/EDGE Radio Access Network; Channel Coding (Release 4); 3GPP TS 45.003 V4.1.0 (Nov. 2001).

* cited by examiner

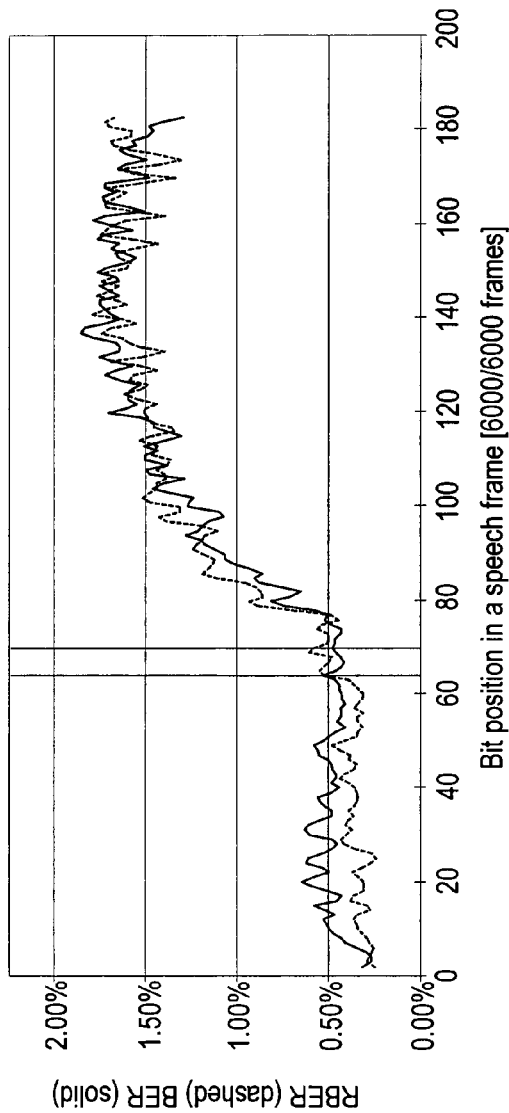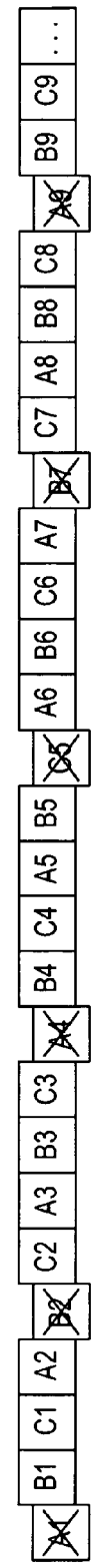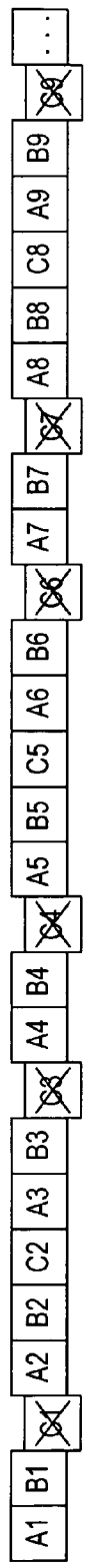
Fig. 3
Fig. 4A (prior art)
Fig. 4B

US 7,610,543 B2

METHOD AND APPARATUS FOR PUNCTURING WITH UNEQUAL ERROR PROTECTION IN A WIRELESS COMMUNICATION SYSTEM

CROSS REFERENCE TO RELATED APPLICATION

Reference is made to and priority claimed from U.S. provisional application Ser. No. 60/390,257, filed Jun. 18, 2002, and entitled ADAPTIVE PUNCTURING ALGORITHM UTILIZING UNEQUAL ERROR PROTECTION SCHEME.

The present invention is related to the following co-pending and co-owned U.S. application:

U.S. Ser. No. 10/040,885, entitled "METHOD AND SYSTEM FOR ALLOCATING CONVOLUTIONAL ENCODED BITS INTO SYMBOLS BEFORE MODULATION FOR WIRELESS COMMUNICATION," and filed on Jan. 2, 2002.

The subject matter of the related application is hereby incorporated by reference in its entirety.

TECHNICAL FIELD

The present invention pertains to the field of encoding data bits for communication between codecs in a wireless communication system. More particularly, the present invention pertains to puncturing a bit stream having error correction bits, so as to eliminate enough bits in the bit stream to match the rate of bits coming from the bit stream to the rate at which the bits are transmitted by the wireless communication system.

BACKGROUND ART

In modern cellular systems channel coding for speech parameters is performed based usually on convolutional codes designed so that encoders will generate an integer number of coded bits for each input source bit (as opposed to e.g. three coded bits for every two input source bits). Because of the bits added by the coder to provide redundancy to the bit stream, sometimes some of the encoded bits must be deleted before transmission (i.e. punctured) in order to match the rate of bits coming from the bit stream to the rate at which bits are transmitted.

FIG. 6 illustrates some of the principal components of a wireless communication system including a codec (encoder/decoder) using convolutional encoding. At the transmitting end, input bits are encoded by a (channel) encoder 10 including, in order, a convolutional encoder module 10a, a puncturing module 10b, and a serial to parallel conversion followed by an interleaving module 10c. (The input bits are typically already source encoded to remove unnecessary redundancy before arriving at the encoder 10.) After encoding the input bits to provide symbols each corresponding to some number of input bits, the symbols are each used (in turn) to modulate a waveform in a modulator 12, and the modulated waveforms are then communicated to a de-modulator 14 on the receiver side via a transmission channel (here including the actual transmitter and receiver equipment). On the receiving side, after the de-modulator determines a symbol (representing the received encoded bits provided no error in transmission has occurred) corresponding to each received modulate waveform, a channel decoder 11 (including, in order, a module 11c for de-interleaving and converting symbols to bits, a module 11b for inserting punctured bits, i.e. for inserting 0's for each punctured bit according to predefined puncturing tables indicating in the encoder which bits to puncture out and copies of the same tables in the decoder indicating where bits were punctured out and so where to insert zeros, and a convolutional decoder 11a) examines the received symbols and provides a corresponding output bit stream, possibly removing some errors in transmission thanks to the forward error correction capacity of the communication system provided by the convolutional encoder 10a and corresponding decoder 11a. (The interleaving operation is vital when convolutional codes are used, because such codes are designed to cope well with random errors and their performance decreases dramatically if the errors are bursty and interleaving is not used.)

Where all the data bits to be communicated can be assumed to have equal importance, such as when the data bits are not encoded by an encoder module like the encoder module 10a, puncturing is straightforward; in such situations, data bits are simply punctured out evenly over a codec frame to maintain some same average error protection capability over the entire codec frame. For encoded speech signals, the situation is quite different because it is often the case that some coded (encoded) bits are more important to subjective speech quality while errors in other bits cause only some acceptable degradation (roughness) in the transmitted speech signal, and so some of the bits of an encoded speech bit stream have to be more heavily protected (by the bits added by the convolutional encoder) against channel errors than others of the bits; such protection is provided by what are called unequal error protection schemes (UEPs) often used in speech transmission.

Although, the benefit of unequal error protection in the transmission of speech signals is known, some state of the art technologies such as WCDMA (Wideband Code Division Multiple Access) specified by 3GPP (Third Generation Partnership Program) do not fully exploit UEP schemes for speech traffic. In a 3GPP/WCDMA system, UEP is made possible by dividing a speech encoded frame into sub-sequences and by coding them with separate Equal Error Protection (EEP) channel codecs (3GPP TS 25.212) so as to create different sub-sequences having different error protection, with the result that the encoded frame has a rough, stepwise kind of unequal error protection. Such a stepwise UEP scheme is not the most optimal for speech services, but certainly improves the error robustness compared to what is provided by a pure EEP scheme.

The main idea behind using generic channel codecs in a 3GPP/WCDMA system to provide stepwise UEP is to avoid having to use channel codecs specialized to each type of transmitted data. But in case of speech, a specialized codec providing UEP is advantageous, and there are other applications besides speech (such as image coding) that might also be improved by using specialized channel codecs. However, if data from all such applications each had its own traffic channel (one for speech, one for graphics, and so on), system complexity could become unacceptable. As it is, designers of the 3GPP/WCDMA systems have determined that the non-optimality of EEP channel coding can be compensated for by transmitting at higher power.

On the other hand, the (older) GSM (Global System for Mobile Communications) system does use dedicated channels for speech transmission (TCH/FS, TCH/HS, TCH/EFS, TCH/AFS, TCH/AHS, O-TCH/AHS), as set out in 3GPP TS 45.003. The latest channel codecs of GSM have a puncturing system that finds the most optimal error protection for each speech encoded bit, thus maximizing the overall speech quality in the transmission.

FIG. 1 gives an example of bit error rate (BER) distribution for bits in a frame of speech data after encoding by a channel encoder highly optimized for speech transmission and then decoded. Two different bit position classes are shown: class $C_A$ includes bit positions from 1 to 64 where the most important bits (bits that are the most critical to subjective speech quality) are conveyed, and also includes bit positions from 65 to 70 where cyclic redundancy check (CRC) bits are inserted into the encoded bit stream for detecting errors in transmission of the data bits of class $C_A$; and class $C_B$ includes bit positions from 71 to 177 where the remaining speech encoded bits are carried, those not as critical to subjective speech quality. In the example shown in FIG. 1, as is usually done, all bits were first reordered in the channel encoder according to subjective importance before any other action was performed by the encoder, with the most important bit placed in bit position 1 and the least important bit in bit position 177.

It can be seen that the BER curve for the class $C_A$ bits is quite flat (nearly the same for all bits) and of low amplitude, both for the data bits of class $C_A$ (highly important to speech quality) and for the CRC bits in class $C_A$. The channel codec is designed to provide such a flat, low-amplitude bit error rate for class $C_A$ bit positions because all bits in a frame are usually either kept or discarded depending on the check provided by the CRC bits (i.e. so that an entire whole frame is discarded if any one of the bits belonging to class $C_A$ for the frame is in error). Thus, the overall frame error rate (FER) is minimized when the BER within class $C_A$ bits is flat and small.

In contrast to errors in class $C_A$, a decoder will typically not reject an entire frame of bits with bit errors in bits in other than class $C_A$, bits which are typically increasingly less important to speech quality (i.e. the bits in the higher bit positions are less important than the bits in the lower bit positions), and so for optimal error protection for such bits, the protection capability decreases as the bit position increases (i.e. as the subjective importance of the source bits decreases).

Since puncturing to achieve rate matching weakens error protection (by removing redundancy), it is obviously advantageous to preferably puncture less important bits before puncturing more important bits.

A convolutional encoder, which is usually implemented as a shift register, can be completely described by a connection diagram, such as the connection diagram 110 of FIG. 7 for a rate R=1/2 encoder (2 output bits for every input bit), showing three delay elements 111a 111b 111c, and two adders 112 114. The code rate R is in general written as k/n indicating that the encoder maps a k-tuple to an n-tuple. It is possible to more concisely describe an encoder than by providing a connection diagram. One more concise specification can be given by stating the values of n, k, and the so-called constraint length K (defined in different ways, such as the number of k-tuples that affect the formation of each n-tuple during encoding). For the encoder of FIG. 7, n=2, k=1, and K=3. Another way is to give the adder connections in the form of either generator vectors or generator polynomials. For example, the rate 1/2 code of FIG. 7 has the generator vectors $g_1$=111 and $g_2$=101, or equivalently, the generator polynomials $g_1(x)=x^2+x+1$ and $g_2(x)=x^2+1$, where x is the delay and modulo 2 addition is used in all calculations involving the generator polynomials so that, e.g. $(x+1)g1(x)=x^3+1$. (with x having the value of one delay element, i.e. a delay of one sample, $x^0=1$ indicates no delay, $x^1$ indicates a delay of one sample, $x^2$ indicates a delay of two samples, etc.)

A (generator) polynomial produces only one bit at a time, but for an entire frame's worth of bits, each polynomial contributes a bit multiple times, the same number of times for each polynomial. If all input bits to a polynomial have the same importance, then all output bits of the polynomial also have the same importance. Different polynomials have different importance, i.e. all the polynomial do not make an equal contribution to error protection performance of the convolutional code. Some applications, like speech codecs, provide source bits for the convolutional encoder, but all the bits do not have equal subjective importance and thus the output bits from the convolutional encoder do not have equal importance (even if the generator polynomials would have equal contribution to error protection performance). Thus, to puncture preferentially less important bits when manually optimizing puncturing for a codec having a convolutional encoder producing bits that are not all of the same importance (and so to provide an optimized UEP channel codec), the puncturing can be performed on the basis of the different importance of different bits and also on the basis of the different importance of different polynomials associated with the convolutional encoder. In other words, puncturing can be performed on a bit-by-bit basis and also on a polynomial-by-polynomial basis.

Optimized UEP channel codecs for speech traffic transmission exist, but all such codecs exploit dedicated and manually optimized puncturing tables. Existing prior-art systems that use generic (low complexity) algorithms for puncturing, do not use UEP but instead use EEP and unsophisticated puncturing.

The modulation technique used—e.g. 8 phase shift keying (PSK) modulation—is another factor in the design of optimal puncturing for convolutional codes for speech traffic channels, especially when multiple bits are transmitted as a single symbol (e.g. in 8-PSK modulation, 3-bits are conveyed per symbol). In such systems some of the bits in the transmitted symbols may have higher error probability than others. Modulation in such systems causes a phenomenon that is sometimes called "soft puncturing" (of the bits that have the weaker protection) because the modulation technique weakens the error protection just as (hard or real) puncturing does, where bits are actually removed from the bit stream. For example, in 8-PSK modulation, one of the bits of the three bits of a symbol has twice the error probability compared to the other two bits. More specifically, "soft puncturing" is the act of assigning a bit to a position in a bit stream so that when it is converted to a symbol it is in a position having weaker protection.

Although in 3G channel coding there is a clear advantage in using a generic coding method to minimize the channel codec complexity, there is a clear drawback in the way a generic coding method performs (hard) puncturing (i.e. puncturing for rate matching). In generic coding, bits are evenly punctured out of the convolution encoded stream, i.e. independently of what polynomial they are originate from. Such puncturing degrades the error protection capability of the code, because, as mentioned, (the bits from) all the different convolutional polynomials are not equally important. Puncturing of (bits from) some of the polynomials has less impact to the code properties (related to error protection) than puncturing of some other polynomials. Therefore closer control of puncturing (puncturing polynomial by polynomial) would increase the performance of a 3G channel codec.

Other drawbacks in a prior art 3G channel coding system for speech traffic channels are associated with the use of EEP schemes, as also already mentioned. As explained above, the only possible way in a 3G system to introduce some difference in error protection for different importance classes (e.g. $C_A$ & $C_B$) is to split the speech encoded data into two or more separate streams and channel encode each using separate convolutional codes and then transmit each in a separate is transport channel, providing "stepwise" UEP. Besides only approximating true UEP, general coding theory states that overall coding efficiency degrades when data being encoded is split into parts and coded separately. Further, stepwise UEP with its several convolutional codes costs more than true UEP, since there is an additional cost associated with the tailing bits of each additional convolutional code.

Current GSM systems use hand-optimized puncturing tables which provide UEP with flat protection for the most important bits and smoothly decreasing protection performance as a function of decreasing bit importance for all other bits. In addition, existing GSM systems use a dedicated transport channel for speech data optimized by exhaustive objective and subjective speech quality evaluation. If the number of different supported speech codecs is increased to provide UEP, the implementation complexity of the entire channel codec increases as does the complexity of the implementation testing. Currently, the number of channel codecs in GSM systems is increasing; the latest speech codecs, called AMR (Adaptive Multi Rate) and AMR-WB (Adaptive Multi Rate-Wide Band) codecs have eight and nine different operation modes (each having an associated channel codec) respectively. Examples of channel modes are: GMSK (Gaussian Medium Shift Keying) full rate, GMSK half-rate, 8-PSK full rate, 8-PSK half rate. Currently there are 25 different channel codecs specified for GSM systems (TCH/FS, TCH/HS, TCH/EFS, TCH/AFS 12.2, TCH/AFS 10.2, TCH/AFS 7.95, TCH/AFS 7.4, TCH/AFS 6.7, TCH/AFS 5.9, TCH/AFS 5.15, TCH/AFS 4.75, TCH/AHS 7.95, TCH/AHS 7.4, TCH/AHS 6.7, TCH/AHS 5.9, TCH/AHS 5.15, TCH/AHS 4.75, O-TCH/AFS 12.2, O-TCH/AFS 10.2, O-TCH/AFS 7.95, O-TCH/AFS 7.4, O-TCH/AFS 6.7, O-TCH/AFS 5.9, O-TCH/AFS 5.15, O-TCH/AFS 4.75), but that number will increase when channel codecs for AMR-WB codec (in GMSK full rate, 8-PSK full rate and 8-PSK half rate channel modes) are specified.

Because the latest GSM channel codecs (for AMR and AMR-WB) have been designed so that their puncturing is optimized for each codec and for each codec mode by manually determining (tuning) a respective puncturing table, there are now many quite large puncturing tables, and so implementing all GSM channel codecs requires a large amount of memory and exhaustive implementation testing (since operation in every mode must be separately tested in a large number of channel conditions).

What is needed is a generalized puncturing algorithm that combines the benefits of manually optimized puncturing tables (providing optimal performance) as in GSM channel codecs, with the benefits of generic puncturing algorithms (providing lower complexity and simpler implementation testing) as in 3G channel codecs.

DISCLOSURE OF THE INVENTION

Accordingly, in a first aspect of the invention, a method is provided for channel encoding and decoding data bits for transmission via a wireless communication channel a frame at a time, each frame consisting of a predetermined number of the data bits, each of the data bits predetermined to belong to one or another of a plurality of ordered predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, the method characterized by puncturing steps including: a step of determining how many bits to puncture in each protection class so as to achieve either the predetermined desired level of error protection for the protection class or a different desired level of error protection arrived at by iteration to avoid determining a negative value of bits to puncture from any class; and a step of identifying which bits to puncture for each class so as to provide relatively strong and uniform protection for all bits in the first class $C_A$, and so as to provide for each other class $C_B, \ldots, C_Z$ protection that. decreases in the same manner as the subjective importance decreases from the beginning of the class to the end of the class, and for then providing information indicating which bits to puncture and in which order to puncture the bits.

In accord with the first aspect of the invention, each class $C_A, C_B, \ldots, C_Z$ may include bits provided by one or more respective generator polynomials each of which provides bits of possibly different importance in respect to error protection and so each of the generator polynomials for the class may be more or less important than others of the generator polynomials of the class, and in the step of identifying which bits to puncture for each class, at least some bits originating from the less important generator polynomials may be selected for puncturing out before bite originating from the more important generator polynomials.

Also in accord with the first aspect of the invention, the method may be further characterized by: a step of resizing the predetermined first two classes so as to enlarge the first class by a number of bits approximately equal to 10% of the size of the first class, and to decrease the second class by the same number of bits.

Also in accord with the first aspect of the invention, the method may be further characterized by: a step of determining how many weak bits to allocate to each class $C_A, C_B, \ldots, C_Z$ so as to maintain the predetermined desired level of error protection; and a step of identifying which weak bits to allocate to each class $C_A, C_B, \ldots, C_Z$ so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

Still also in accord with the first aspect of the invention, the method may be further characterized by: a step of either constructing a puncturing table and performing the puncturing using the puncturing table, or performing the puncturing without using a puncturing table.

Still also in accord with the first aspect of the invention, the method may also comprise inverse puncturing steps, responsive to information indicating which bits to puncture and in what order.

In a second aspect of the invention, an apparatus is provided for channel encoding a data bits for transmission via a wireless communication channel a frame at a time, each frame consisting of a predetermined number of the data bits, each of the data bits predetermined to belong to one or another of a plurality of ordered predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, the apparatus characterized by: means for determining how many bits to puncture in each protection class so as to achieve either the predetermined desired level of error protection for the protection class or a different desired level of error protection arrived at by iteration to avoid determining a negative value of bits to puncture from any class; and means for identifying which bits to puncture for each class so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

In accord with the second aspect of the invention, each class $C_A, C_B, \ldots, C_Z$ may include bits provided by one or more respective generator polynomials each of which provides bits of possibly different importance in respect to error protection and so each of the generator polynomials for the class may be more or less important than others of the generator polynomials of the class, and in identifying which bits to puncture for each class, at least some bits originating from the less important generator polynomials may be selected for puncturing out before bits originating from the more important generator polynomials.

Also in accord with the second aspect of the invention, the apparatus may be further characterized by: means for resizing the predetermined first two classes so as to enlarge the first class by a number of bits approximately equal to 10% of the size of the first class, and to decrease the second class by the same number of bits.

Also in accord with the second aspect of the invention, the apparatus may be further characterized by: means for determining how many weak bits to allocate to each class $C_A$, $C_B, \ldots, C_Z$ so as to maintain the predetermined desired level of error protection; and means for identifying which weak bits to allocate to each class $C_A, _B, \ldots, C_Z$ so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

Sill also in accord with the second aspect of the invention, the apparatus may be further characterized by means for either constructing a puncturing table and performing the puncturing using the puncturing table, or for performing the puncturing without using a puncturing table.

Also in accord with the second aspect of the invention, the apparatus may also comprise inverse puncturing means, responsive to information indicating which bits to puncture and in what order.

In a third aspect of the invention, a system is provided comprising a plurality of wireless terminals and a base station, at least one of the wireless terminals and the base station each including: a channel encoder, responsive to input bits, for providing transmitter side symbol waveforms, characterized in that it includes an apparatus as in the first aspect of the invention; and a channel decoder, responsive to the transmitter side symbol waveforms as modified by a communication channel, including means for performing steps undoing any puncturing performed on bits conveyed by the transmitter side symbol waveforms.

The invention thus provides for a convolutional codec a generalized puncturing algorithm that combines the benefits of manually optimized puncturing tables (optimal performance) as in GSM channel codecs and generic puncturing algorithms (lower complexity and simpler implementation testing) as in 3G channel codecs, by providing a procedure to generate puncturing tables for each application (coded/codec mode) without the need for separate puncturing tables for each application. Although generalized puncturing algorithms usually perform less well than manually optimized puncturing schemes, the generalized puncturing algorithm of the invention makes the difference marginal. In first puncturing (removing) bits originating from the least important polynomial of a convolutional codec (the polynomial whose bits have the smallest effect on the convolutional codec properties), the algorithm mimics manually optimized puncturing (using manually tuned puncturing tables).

BRIEF DESCRIPTION OF THE DRAWINGS

The above and other objects, features and advantages of the invention will become apparent from a consideration of the subsequent detailed description presented in connection with accompanying drawings, in which:

FIG. 3 is a graph of a comparison of the bit error rates graphed in FIGS. 1 and 2, the solid line for a manually optimized channel codec and the dashed line for a channel codec using the generalized algorithm according to the invention.

FIGS. 4A and 4B are schematic illustrations of puncturing for a first (most important) class of bits according to a prior art system (such as e.g. a 3G rate matching system) and according to the invention, respectively.

BEST MODE FOR CARRYING OUT THE INVENTION

The invention provides a generalized puncturing algorithm incorporating techniques used in manual tuning of puncturing tables for use with convolutional coding, and, in addition, for accounting for soft puncturing by multi-bit/symbol modulation systems (such as an 8PSK modulation system) in which some bits (called weak bits) are transmitted as part of a symbol with less protection than other bits (called strong bits) of the symbol.

Puncturing and the allocation of weak bits in systems transmitting multiple bits per symbol are by far the most challenging aspects of the operation of a channel codec to automate. When automated, as explained below, only one module remains needing a large predefined data table for providing unequal error protection (UEP), a subjective importance ordering module, which executes before channel coding. Subjective importance ordering depends on the speech codec itself, not on the communication channel, and cannot be automated.

As in manually determining puncturing tables, in the preferred (typical) embodiment for a speech codec, the generalized puncturing algorithm of the invention assigns bits (data bits and redundancy bits) of a frame to one of two classes. First class $C_A$ includes bit positions from 1 to 64 where the most important bits (bits that are the most critical to subjective speech quality) are conveyed; class $C_A$ also includes bit positions from 65 to 70 where cyclic redundancy check (CRC) bits are inserted into the encoded bit stream for detecting errors in transmission of the data bits of class $C_A$. Second class $C_B$ includes bit positions from 71 to 177 where the remaining speech encoded bits are carried, those not as critical to subjective speech quality.

Figure 5A:
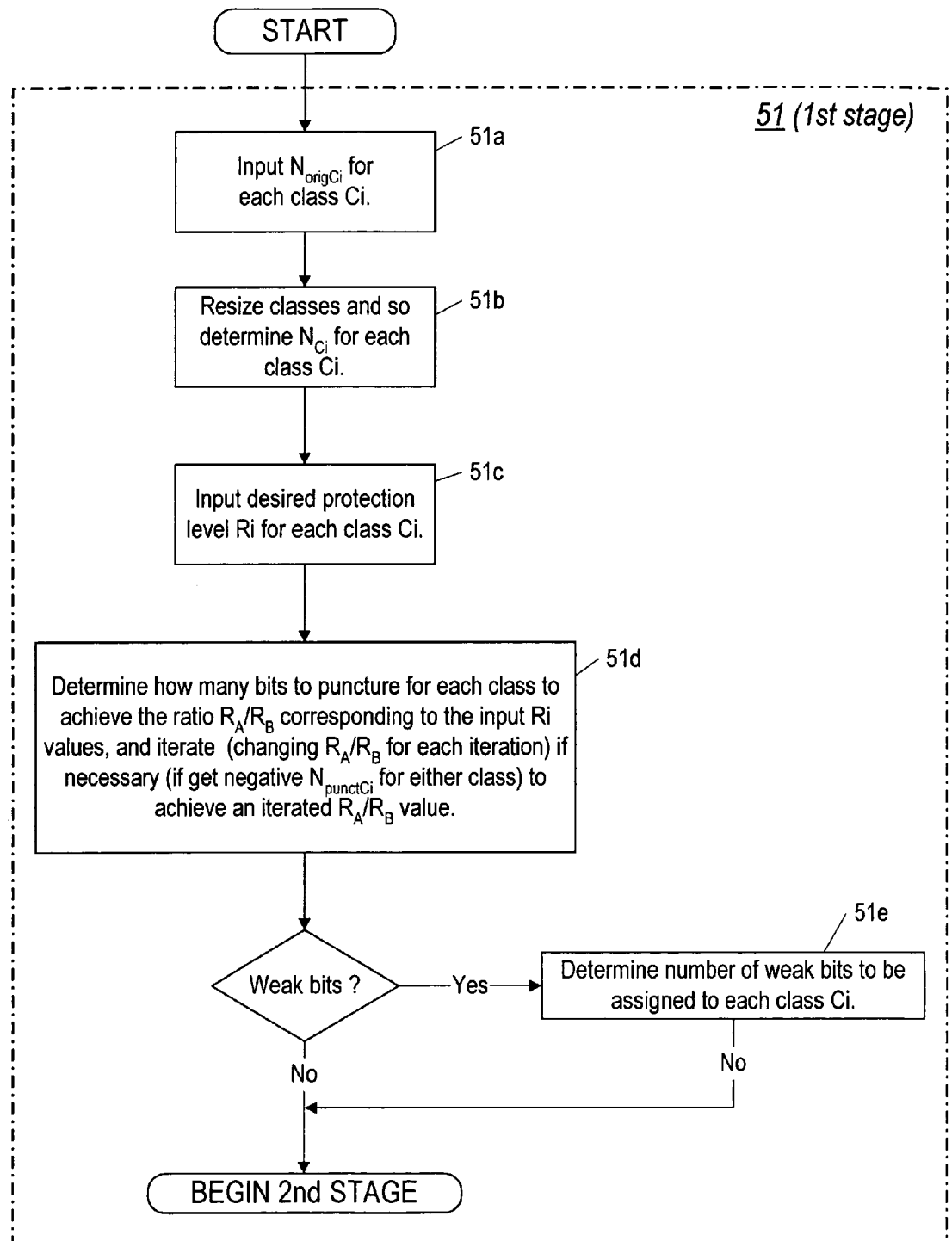
FIGS. 5A-C are in combination a high level functional diagram of a method provided by the invention.
Figure 5B:
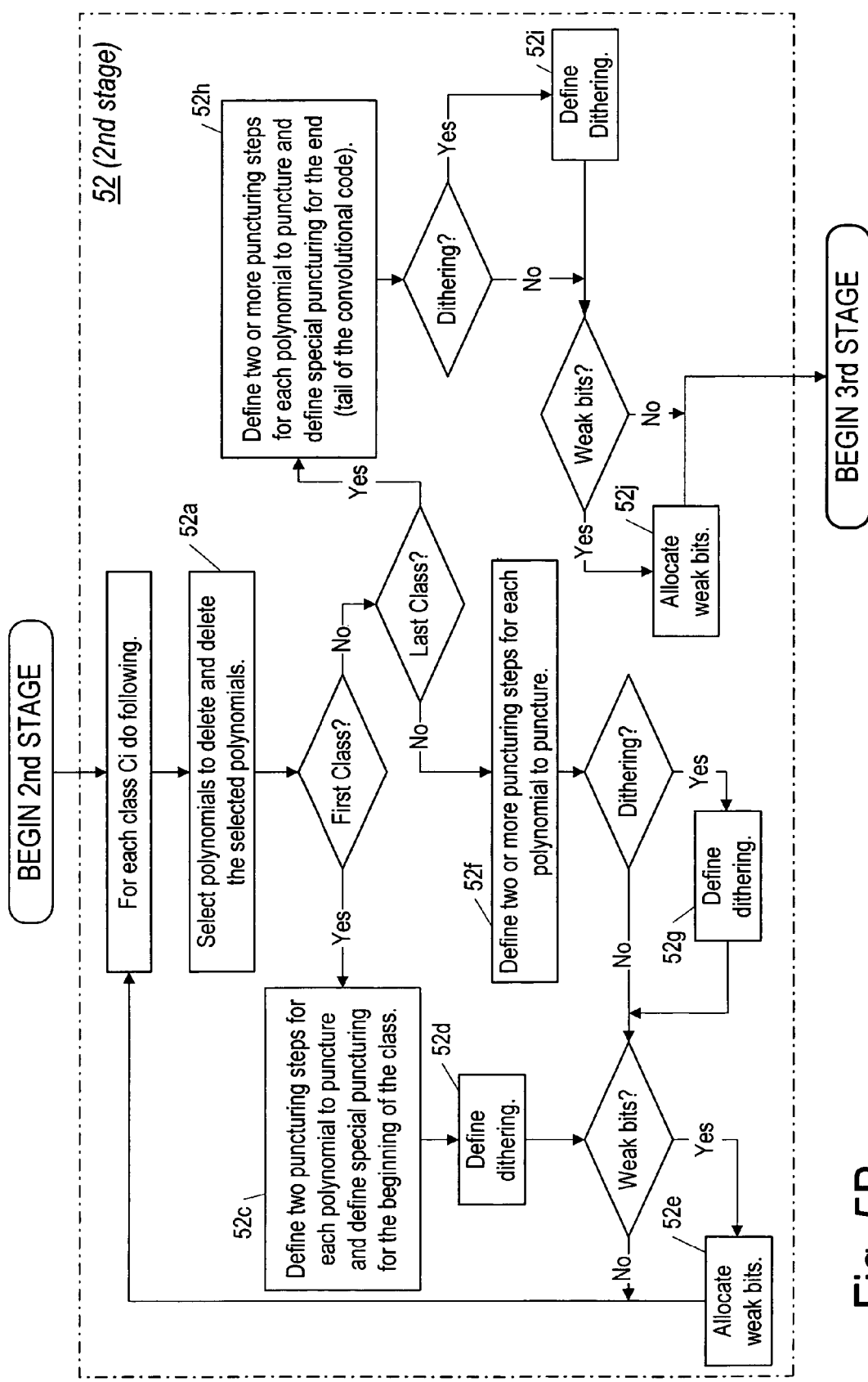
Figure 5C:
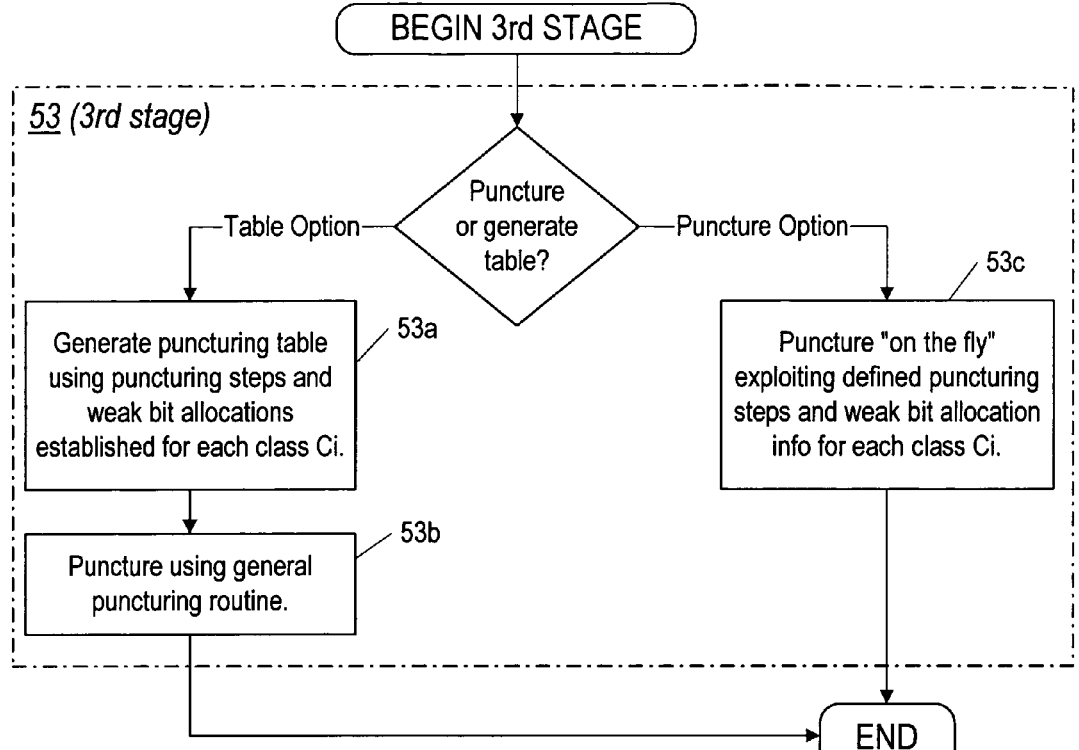
Figure 7:
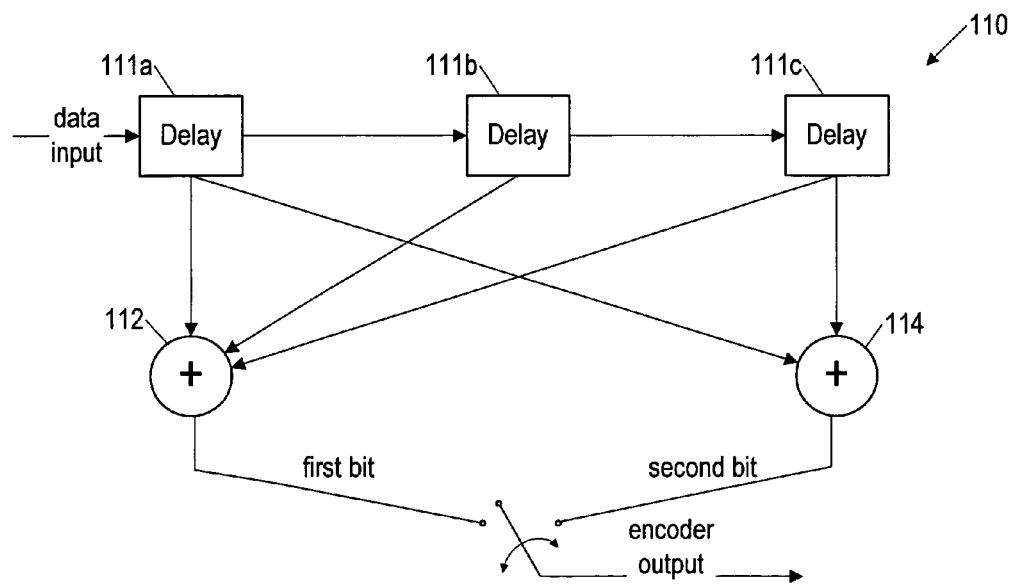
FIG. 7 is a schematic illustration of an implementation of an exemplary (prior art) convolutional encoder.
Figure 6:
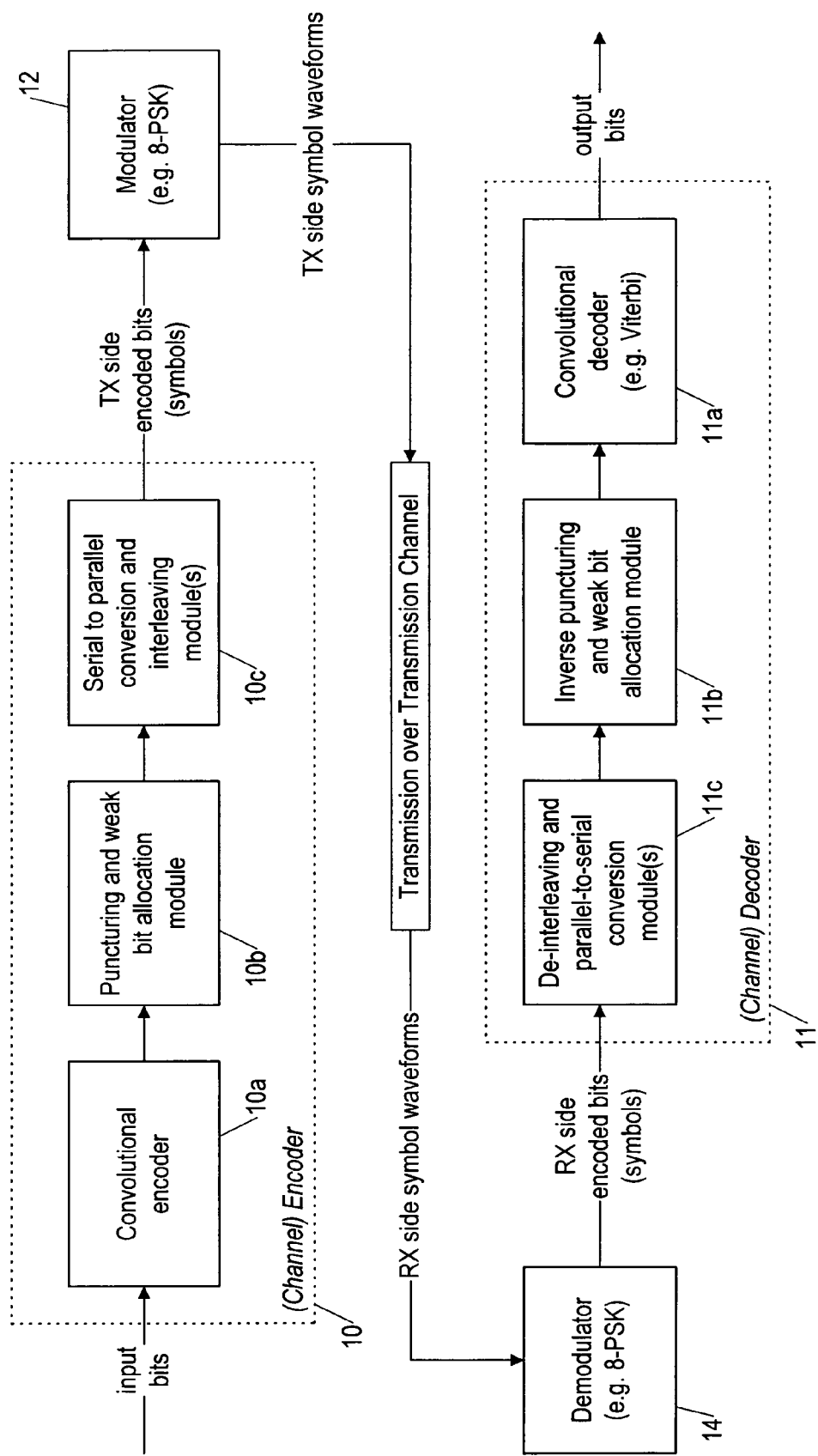
FIG. 6 is a context diagram of a communication system of a type in which the invention can be used, including an encoder performing convolutional encoding and also performing puncturing (which can be done according either to the invention or to the prior art).

FIGS. 5A-C in combination illustrate a generalized puncturing algorithm according to the invention, and FIG. 6 shows a communication system including a convolution coder 10a and a puncturing module 10b implementing the generalized puncturing algorithm of the invention. Referring now to FIGS. 5A-C, the steps (at a high-level) of the generalized puncturing algorithm provided by the invention are indicated as belonging to one or another of three stages 51 52 53. In the first stage 51, given the total number of bits that must be punctured out of a bit frame (for matching the rate of arrival of bits as components of symbols at the transmitter to the rate of transmission by the transmitter) the algorithm calculates how many bits are to be punctured out of each of the two protection classes $C_A$ and $C_B$ (more than two protection classes are also possible) so as to achieve a predetermined desired (usually different) level of error protection for each class, and also calculates how many weak bits (if any, depending on the modulation being used) are to be allocated to each class to maintain the predetermined desired levels of error protection. In the second stage 52, the algorithm iterates to determine which bits in particular (i.e. to identify specific bits) to puncture in each class and which weak bits in particular to assign to each class identifying which bits to puncture for each class ($C_A$ $C_B$) so as to provide relatively strong and uniform protection for all bits in the first class $C_A$, and so as to provide for the second class $C_B$ protection that decreases in the same manner as the subjective importance decreases from the beginning of the second class $C_B$ to the end. In the third stage 53, the algorithm either constructs a puncturing table (i.e. a puncturing matrix) or performs the puncturing "on the fly" (i.e. without using a table), depending on which alternative is preferred. It should be noted that all state-of-the-art channel codecs allocate the most important bits to the beginning of a convolutional code, and the description here assumes such an allocation is performed on the input to the generalized puncturing algorithm, i.e. before the bits reach the first processing stage of the algorithm. If not, then the generalized puncturing algorithm provided by the invention is adapted to whatever allocation procedure is used.

One important feature of the invented algorithm is that once the protection classes (each an ordered set of bits) are defined, i.e. once bits in position 1 through some position number $N_1$ are assigned to the first class $C_A$, and so on, according to the prior art (3GPP TS45.003), the algorithm automatically increases the size of the first class $C_A$ by some factor D, typically around 10% and, correspondingly, reduces the size of the second class. This is done because the algorithm does not provide a flat error protection curve for all of the first class, but instead provides somewhat lower protection for the bits at the end of the ordered set of the first class bits. The D factor can be adaptive, i.e., the bigger the difference between the protection of two consecutive classes, the bigger the increase used to compensate for the weakened protection following the most important bits.

Detailed Description of the First Stage

In a first step 51a, the classes are input in terms of the numbers $N_{origC_A}$ and $N_{origC_B}$ for each of the two protection classes $C_A$ and $C_B$ so that the bits in class $C_A$ are the bits in positions 1 through $N_{origC_A}$ and the bits in class $C_B$ are the bits in positions $N_{origC_A}+1$ through $N_{origC_A}+N_{origC_B}$. The total number of bits in a frame is thus $N_{origC_A}+N_{origC_B}$.

In a next step 51b, the classes are resized:

$$N_{C_A}=N_{origC_A}+\lfloor D \times N_{origC_A} \rfloor \qquad (1)$$

and $$N_{C_B}=N_{origC_B}-\lfloor D \times N_{origC_A} \rfloor \qquad (2)$$

(in which $\lfloor x \rfloor$ indicates the integer part of x, i.e. the integer closest to but not greater than x) so that $N_{C_A}$ and $N_{C_B}$ are the number of bits in class $C_A$ and class $C_B$ respectively after resizing (the total number of bits being unchanged), and D (input or embedded in the algorithm) corresponds to the size of the transition region between class $C_A$ and $C_B$ expressed as a fraction of $C_A$, typically on the order of 10%.

Next, with the bits to be transmitted assigned to one of two predetermined (per the prior art) classes, a first class $C_A$ and a second class $C_B$ (two classes being a typical case for channel coding for speech parameters), in a step 51c the desired level of error protection capability for each class is input as a ratio $R_i$ (i.e. $R_A$ or $R_B$) for each class $C_i$ (i.e. $C_A$ or $C_B$), where $$R_i = \frac{N_{C_i}}{N_{C_i}R - N_{punctC_i}}, \qquad (3.1)$$

in which $N_{punctC_i}$ is the number of bits to be punctured from class $C_i$ and R is the coding rate of the convolutional code. The ratio $M_{AB}$ of the error protection capability of the class CA to that of class CB is thus:

$$M_{AB} = \frac{R_A}{R_B}. \qquad (3.2)$$

When we set the ratio $M_{AB}$ of the error protection capability of the two classes to a desired fixed value, since we know the total number $N_{punctTotal}$ of bits that must be punctured for rate matching for the channel in use, we can express the number of bits that must be punctured in class $C_B$ in terms of the number of punctured bits in class $C_A$ as follows:

$$N_{punctC_B}=N_{punctTotal}-N_{punctC_A}. \qquad (4)$$

By substituting eq. (4) into eq. (3.1 and 3.2), we can solve for the number of bits that must be punctured in class $C_A$ to achieve some predetermined value of $M_{AB}$. After that, we can then get the number of bits that must be punctured in class $C_B$ using eq. (4). Sometimes it can happen that the desired difference in protection for the two classes (as set by $M_{AB}$) cannot be achieved exactly. Using eqns. (3.1), (3.2) and (4) as described, we can end up having a negative value for either class $C_A$ or class $C_B$, and so we cannot actually achieve the predetermined value of $M_{AB}$, or, equivalently, we cannot actually achieve the protection level $R_i$ for each of the two classes. A negative value for class $C_A$ means that even if we do not puncture the class $C_A$ at all, we cannot achieve the required protection difference between the two classes. A negative value for class $C_B$ means that the number of punctured bits needed to achieve the desired protection difference is more than the total number of bits required to be punctured to fit the coded stream into the channel, i.e. for rate matching. The former error condition (negative $C_A$ value) may happen quite often, but the latter case (negative $C_B$ value) is more rare because we usually assume that the ratio $M_{AB}$ is less than one, meaning that puncturing should be less in class $C_A$.

Thus, in a next step 51*d*, the algorithm determines the number of bits in each class to puncture to achieve the input value of protection $R_i$ (preferably relative to the value of protection in some other class or other classes), but in case of either a negative $N_{punctC_A}$ or $N_{punctC_B}$ value, the algorithm iterates using different values of $M_{AB}$ (higher or lower depending on whether $N_{punctC_A}$ or $N_{punctC_B}$ is negative) to find the closest ratio to the original ratio resulting in non-negative values for both $N_{punctC_A}$ and $N_{punctC_B}$. For example, if $M_{AB}$ is initially set to 0.85 and it results in a negative value for $N_{punctC_A}$, the algorithm increases the desired ratio $M_{AB}$ by a small amount (such as 0.1 or about 10% of the original value) and again solves for $N_{punctC_A}$ and $N_{punctC_B}$.

When the determination of the number of punctured bits for each class is complete (and a corresponding value of $M_{AB}$ is determined, possibly different from the original value), if the transmission modulation being used is a multiple bit per symbol scheme and has a higher bit error rate for some bits of a symbol than for others, i.e. there are weak bits as a result of the modulation being used (as is the case e.g. the GERAN 8-PSK modulation, where one bit out of every three bits in the transmission channel has around twice the bit error rate compared to the stronger bits and so one out of three is a "weak" bit), then in a next step 51*e*, the algorithm determines the number of weak bits of a frame to allocate to each of the two classes so as to maintain the value of $M_{AB}$ given by eq. (3.2). The procedure for the allocation is as follows. First, the algorithm substitutes into eq. (3.2) the unknown numbers $N_{softC_A}$ and $N_{softC_B}$ of soft (weak) bits to be allocated to the two classes for the variables $N_{punctC_A}$ and $N_{punctC_B}$ representing the number of bits to be punctured in each of the two classes, which results in the following equation for defining the allocation of soft (weak) bits among the two classes $C_A$ and $C_B$:

$$M_{AB} = \frac{N_{C_A}}{N_{C_A}R - N_{softC_A}} \bigg/ \frac{N_{C_B}}{N_{C_B}R - N_{softC_B}}, \quad (5)$$

where $M_{AB}$ has either its predetermined (or input) value or the value resulting from the iteration of step 51*d*. Next, the algorithm expresses the number $N_{softC_B}$ of weak bits in class $C_B$ in terms of the number $N_{softC_A}$ of weak bits in class $C_A$, knowing the total number $N_{softTotal}$ of soft bits:

$$N_{softC_B} = N_{softTotal} - N_{softC_A}. \quad (6)$$

After solving eqns. (3.2) through (6), both the required numbers of bits to be punctured in each class and also the required allocation of weak bits among both classes is determined.

Detailed Description of the Second Stage

The procedure of the second stage is repeated for each class separately.

For some classes the amount of puncturing needed is greater than the number of bits originating from any single generator polynomial. In such a case, and in general, first all the bits from the least important polynomial are punctured, then all the bits from the next least important polynomial, and so on until finally the bits that remain to be punctured are less in number than all the bits of the next least important polynomial and so to puncture the remaining bits, only some of the bits of that polynomial are punctured. The polynomial for which only some bits are punctures is here called the underpuncture polynomial. Thus, for the class $C_i$, the algorithm must determine the number $N_{deletedPolynomialsC_i}$ of polynomials to delete and also the number $N_{punctInUnderpuncturePolyInC_i}$ of bits to be deleted from the underpuncture polynomial in class $C_i$, and does so using the following two equations:

$$N_{punctC_i} = N_{bitsPerPolynomial} N_{deletedPolynomialsInC_i} + N_{punctInUnderpuncturePolyInC_i}, \text{ and} \quad (7.1)$$

$$N_{deletedPolynomialsInCi} = \left\lfloor \frac{N_{punctC_i}}{N_{bitsPerPolynomial}} \right\rfloor, \quad (7.2)$$

in which again, $\lfloor x \rfloor$ is the integer part of x, and where $N_{punctC_i}$ is the (previously determined) total number of bits to be punctured from class $C_i$, $N_{bitsPerPolynomial}$ is the (known) number of bits per polynomial (same for all polynomials, regardless of class), $N_{deletedPolynomialsInC_i}$ is the (to be determined) number of polynomials in class $C_i$ to delete, and $N_{punctInUnderpuncturePolyInC_i}$ is the (to be determined) number of bits to be deleted (punctured) from the underpuncture polynomial for class $C_i$.

Thus, in a step 52*a*, the algorithm first determines for a given class how many and which polynomials are to be entirely punctured (deleted) using eq. (7.2), and then does so.

At this point, following step 52*a*, for the class $C_i$ all that must be done in the second stage is to determine which bits are to be punctured from the underpuncture polynomial and to determine how to account for the weak bits in case of a modulation scheme providing weak bits, i.e. determine what soft puncturing to perform.

If we are processing the first class $C_A$, i.e. if $C_i$ is $C_A$, then in a next step 52*c* we preferably define two puncturing step sizes for the underpuncture polynomial, and also define special puncturing for the beginning of the class, and in a next step 52*d*, we define the dithering to be used, i.e. whether or not to alternate the two puncturing step sizes. These two steps are intended to achieve the aim of making the error protection capability of the first class as flat as possible to minimize the number of frame errors (where an entire frame is rejected, which, as explained, is triggered by any error within the first class). The defining of the step sizes (step 52*c*) and defining the dithering (step 52*d*) is done to puncture the bits (of the underpuncture polynomial) from the first class as evenly as possible. We know that we have to puncture some number of bits out of the bits originating from the underpuncture polynomial, but it seldom happens that the ratio of bits to be punctured to bits originating from the underpuncture polynomial is an integer. For example if we have 99 bits generated by the polynomial G0 and we want to puncture 22 bits, we have to puncture out every $4.5^{th}$ bit (99/22). The easiest way to do so is to perform puncturing with alternating steps of 4 and 5. In other words, we dither those step sizes to get the protection as flat as possible, i.e. we puncture at step sizes of 4, 5, 4, 5, ... and so on until 22 bits are punctured. Thus, we typically alternate the puncturing step sizes with as small a difference in the step sizes as possible so as to create as equal protection as possible over all the bits in the most important class.

The defining of special (heavier) puncturing (step 52*c*) for the beginning of the first class is done to get flat error protection capability for the class; it is necessary to account for the fact that the beginning (as well as the end) of a convolutional code always has better error protection than the rest of the code, i.e. the bits in the end of the class $C_B$ have lower BER than the bits just before them. This is because convolutional coding starts from a known state and ends in a known state, which reduces the number of possible states in the coding trellis leading from the beginning and to the end states. Because we want to make the error protection of the first class $C_A$ as even as possible, in the preferred embodiment of the invention we puncture the very beginning of the first class more heavily than the rest of the class, i.e. we preferably define special (heavier) puncturing for the beginning of the first class.

In addition to steps 52c and 52d in respect to dithering, the algorithm also performs a step 52e of allocating bits in the class at hand so as to be transmitted with lower error protection, i.e. a step of allocating weak bits. If weak bits exist because of the modulation scheme being used, the weak bits are evenly distributed among the bits originating from the underpuncture polynomial. If all the remaining bits from the underpuncture polynomial are allocated for the weak bits and there are still weak bits to allocate, the remaining weak bits are evenly allocated to the bits originating from the next least important polynomial, and so on. (By allocating weak bits in a class, we mean re-ordering the bits in the class so that after modulation, the weak bits are evenly distributed.)

Whereas for the first class $C_A$ we provide relatively strong and uniform protection so as to produce a relatively small and flat bit error rate, when processing other classes besides the first, we do not want to make the error protection flat, but instead we want to have protection decrease in the same manner as the subjective importance decreases from the beginning of the class to the end, and if the class is not the last class (nor the first), then our aim is achieved by a step 52f of defining preferably two or more step sizes for the underpuncture polynomial and a step 52g of defining a dithering pattern. In some applications, for classes other than the first class, we do not define alternating puncturing step sizes to be the closest integers (i.e. 4 and 5 in the previous example) so as to dither the puncturing steps in that way, and we do not even dither the puncturing steps at all. Instead, we sometimes get more of a difference in error protection within the class and use more than two puncturing steps, such as e.g. 3, 4, 5 and 6 instead of just 4 and 5 as in the previous example. Alternatively, we may sometimes define step sizes based on the two closest integers (i.e. 4 and 5) but use them without dithering (i.e. we use steps of 5, 5, 5, . . . , 4, 4, 4, . . . , 4). Whenever we do not use dithering, the convolutional code has error protection that decreases significantly at the end of the class. In addition to steps 52f and 52g in respect to dithering, for other than the first class and the last class, the algorithm also performs the step 52e of allocating bits so as to be transmitted with lower error protection.

If we are processing the last class (the second class $C_B$ in case of only two classes), we take into account the previously discussed special property of the end of the convolutional code and hence we perform a step 52h of defining step sizes and special (heavier) puncturing for the end of the last class, a step 52i of defining the dithering for the last class, and a step 52j of allocating weak bits in the last class.

Detailed Description of the Third Stage

When we have reached the third and the last stage 53 of the algorithm, we have determined the extent of puncturing for each class and the exact puncturing steps for the polynomial(s) to be punctured. In addition, we have determined what bits within each class will be allocated to positions so as to be transmitted as weak bits. Thus, by the third stage 53, we have all the information necessary for puncturing. In performing the puncturing, there are two options. Using the information determined in the first two stages, we can either perform puncturing "on the fly," i.e. without using puncturing tables (matrices) 53c, or we can build puncturing tables (matrices) 53a to be used with a general puncturing routine 53b. Which way is preferable depends on the implementation.

Discussion

For the receive side to recover the source encoded bits (the input bits to the convolutional encoder 10a), the decoder 11, and more specifically the inverse puncturing module 11a, must receive not only the bit stream to prepare for the convolutional decoder (by inserting zeroes for the punctured bits and for reordering the bits to undo the weak bit allocations) but also sufficient information to determine how to perform its functions, i.e. sufficient information to determine the dithering and weak bit allocations made by the (receiver side) puncturing module 10b. In some applications, the dithering and weak bit allocations can be hardwired, and in other cases, they can be dynamic. In case of dynamic dithering and weak bit allocations, the information needed by the inverse puncturing module is preferably communicated using a different channel than is used for the data.

A communication system using the invention preferably includes components as shown and as ordered in FIG. 6, with the serial to parallel (bit to symbol) conversion being performed prior to the interleaving. It is possible however to perform the interleaving before the serial to parallel conversion, but then the puncturing module must take into account the pattern that is to be used in the interleaving operation so as to be able to properly allocate the so-called weak bits among the different protection classes. One way to take into account the interleaving operation is to have the puncturing module 10b (which also makes the weak bit allocations) perform the inverse interleaving operation, make the weak bit allocations, and then perform the interleaving operation, which is then performed one more time by the module 10c performing first the interleaving and then the serial to parallel bit conversion.

Figure 1:
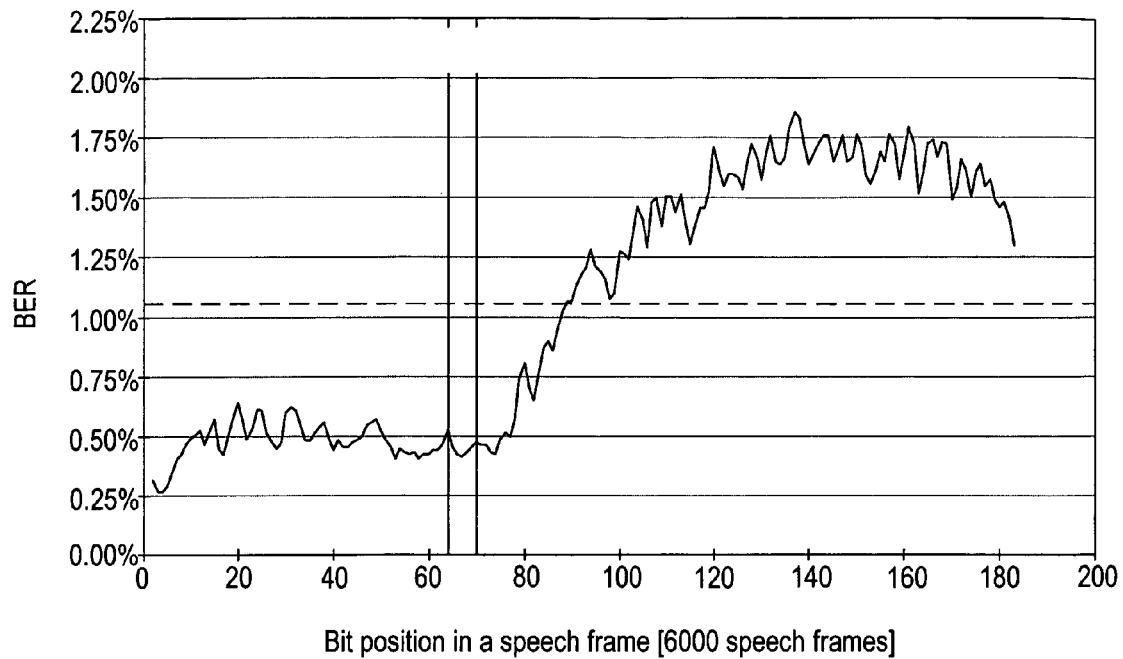
FIG. 1 is a graph of bit error rate in a highly optimized channel codec for speech transmission according to the prior art (optimized by use of manually tuned puncturing tables).
Figure 2:
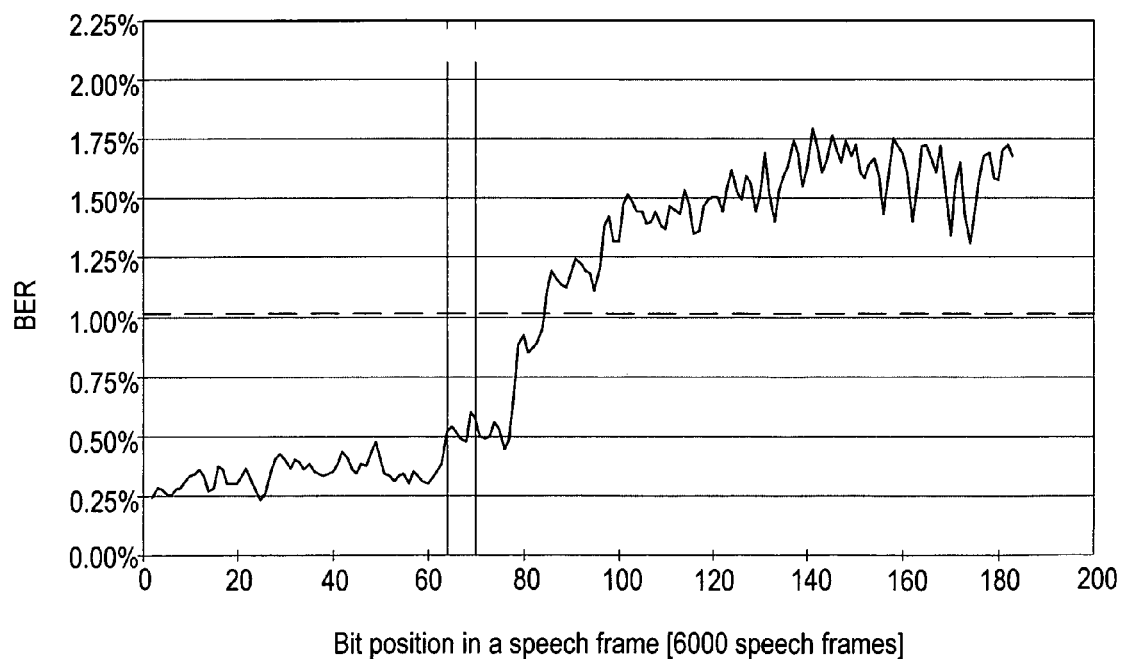
FIG. 2 is a graph of bit error rate in a channel codec using a generalized puncturing algorithm according to the invention.

As mentioned, although generalized puncturing algorithms usually perform less well than manually optimized puncturing schemes, the invention provides a procedure that makes the difference marginal. An example of where the use of manually optimized puncturing tables (FIG. 1) is replaced by the generalized puncturing algorithm according to the invention is illustrated in the FIG. 2, showing that the difference between the methods can be very small.

The difference between a 3G system, which punctures bits without regard from the polynomial that originates the bits, and a system using the generalized puncturing algorithm of the invention (and so puncturing bits from less important polynomials before bits from more important polynomials) is illustrated in FIGS. 4A (puncturing of the first class bits in a 3G system) and 4B (puncturing of the first class bits using the invention). FIGS. 4A and 4B show that whereas the prior art method punctures (the first class) bits (as well as other bits) independently of the polynomial generating the bits, the generalized puncturing algorithm of the invention punctures only bits originating from generator polynomial C (the "least important polynomial" in the sense that the bits it generates have the least effect on subjective speech quality in case of a codec), which improves the performance of the code, i.e. which improves reception.

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

Appendix

Example C-code implementing described system:
    Class $C_A$ is here indicated as 1a and class $C_B$ as 1b. */
    /* Create the puncturing matrix */
    int punctureStepByStep(Word16 *in, int pSteps[ ], int nSource, int rate,
                int nStep, int nPunct, int nDelPol, Word16 punctTable[ ],
                int nSoftPuncture){
        int cPunct, cStep, cBit, cRate;
        Word16 *in2, *pPtr;
        int cSoftpuncture, bitCount = 0, softStep, softOff;
        cPunct = 0;
        in2 = in;
        /* Initialise the puncturing matrix to all ones, i.e., no puncturing as a default*/
        for (cBit=0;cBit<nSource*rate;cBit++)
            puncTable[cBit] – 1;
        /* Puncture out the complete polynomials if required */
            for(cRate=0; cRate < nDelPol; cRate++){
                in = in2 + cRate;
                pPtr = punctTable + cRate;
                for(cBit=0;cBit<nSource;cBit++, pPtr += rate){
                    *pPtr = 0;
                }
            }
        /* Set Pointers to the beginning of first polynomial not totally punctured. */
        in = in2 + nDelPol;
        pPtr = punctTable + nDelPol;
        /* Set number of weak bits (8-PSK) in the first not totally deleted polynomial. */
        if(nSoftPuncture >= nSource – nPunct){
            cSoftPuncture = nSource – nPunct;
            softStep = 1;
        }
        else if(nSoftPuncture > 0){
            cSoftPuncture = nSoftPuncture;
            softStep = (nSource – nPunct) / nSoftPuncture;
        }
        else{
            cSoftPuncture = 0;
            softStep = nSource – nPunct;
        }
        nSoftPuncture = nSoftPuncture – cSoftPuncture;
            /* If the length of data not divisible by number of weak bits, define starting offset
    */
        softOff = nSource – nPunct – softStep * cSoftPuncture;
        /* Then loop through the first polynomial which is only partly punctured */
        for(cStep=0;cStep<nStep;cStep++, pPtr +=rate, in += rate){ /* Copy bits by puncturing
    steps */
            /* Loop through bits in step,*/
            for(cBit=0;cBit < pSteps[cStep]–1; cBit++, pPtr += rate, in += rate, bitCount++){
                if((bitCount%softStep == 0)&&(cSoftPuncture>0)&&(bitCount>=softOff)){
                    cSoftPuncture--;
                    *pPtr = 2;
                }
                else{
                    *pPtr = 1;
                }
            }
            /* Now check whether we have still bits to be punctured left */
            /* If not, then check whether any weaks bits are still unallocated */
            if((cpunct<nPunct)){
                cPunct++;
                *pPtr = 0;
            }
            else if(bitCount%softStep == 0)&&(cSoftPuncture>0)&&(bitCount>= softOff)){
                cSoftPuncture--;
                *pptr = 2;
                bitCount++;
            }
            else{
                *pPtr = 1;
                bitCount++;
            }
        }
        /* Then loop through the rest of the polynomial not punctured, except the */
        /* possible weak bits in 8-PSK */
        for(cRate=nDelPol+1; cRate < rate; cRate++){ /* Loop through single coded bit */
            in = in2 + cRate;
            pPtr = punctTable + cRate;
            /* Define how many weak bits in 8-PSK we can fit into the current polynomial */
            if (nSoftPuncture >= nSource){
                cSoftPuncture = nSource;

Appendix-continued

```
            softStep = 1;
        }
        else if(nsoftPuncture >0){
            cSoftpuncture = nsoftPuncture;
            softStep = nSource / nSoftPuncture;
        }
        else{
            cSoftPuncture = 0;
            softStep = nSource;
        }
        nSoftPuncture = nSoftPuncture - cSoftPuncture;
        softOff = nSource - softStep * cSoftPuncture;
        bitCount = 0;
        /* Copy bits by puncturing steps */
        for(cStep=0;cStep<nStep;cStep++){
            /* Loop through bits in step */
            for(cBit=0;cBit < pSteps[cStep]; cBit++, pPtr += rate, in += rate){
                /* We either have weak bits or normal bits but no puncturing */
                if((bitCount%softStep ==
0)&&(cSoftPuncture>0)&&(bitCount>=softOff)){
                    *pptr = 2;
                    cSoftPuncture--;
                }
                else{
                    *pPtr = 1;
                }
                bitCount++;
            }
        }
    }
    return(cPunct + nDelPol + nSource);
;
/* This subroutine defines the dithering tables for alternating the puncturing steps */
/* and so evening out the error protection properties of the code */
int dither2Steps(int pSteps[ ], int nSteps, int nBaseL, int nBaseH,
        int pBaseStepL, int pBaseStepH)
{
    int i, cL, cH, nL, nH;
    cL = nBaseL;
    cH = nBaseH;
    if(nBaseL == 0){
        nH=nBaseH;
        nL = 0;
    }
    else if(nBaseH == 0){
        nL=nBaseL;
        nH = 0;
    }
    else if((int) (nBaseH / nBaseL)==0){
        nH =1;
        nL = nBaseL/nBaseH;
    }
    else{
        nL=1;
        nH - nBaseH/nBaseL;
    }
    while((cL>0)||(cH>0) {
        for(i=0;i<nH;i++){
            if (cH > 0){
                cH--;
                pSteps[nSteps] = pHaseStepH;
                nSteps++;
            }
        }
        for(i=0;i<nL;i++){
            test( );
            if(cL>0){
                cL--;
                pSteps[nSteps] = pBaseStepL; move16( )
                nSteps++;
            }
        }
    }
    return(nSteps)
}
/* The main puncturing routine, which calls dither2steps( ) and punctureStepByStep( ) */
/* functions */
void FLOCpuncture(Word16 *out, Word16 *out, Word16 BitsPunctured, Word16 BitsConvEncoded,
        Word16 rate, Word16 nClass1a, Word16 nClass1b, Word16 nCRC, Word16
```

Appendix-continued

```
nTail,
        Word16 nSoftBits){
   int i, nPunct, pBaseStepL, pBaseStepH, cGlobalPunctured=0;
   int nBaseL, nBaseH, tmp, n1aAndCRC, n1bAndTail;
   int nPunct1a, nPunct1b, nDelPol1a;
   int nDelPol1b, nDelPolH, nDelPolE, nStep1a, nStep1b, nHead, nEnd;
   int nPunctH, nPunctE;
   int pSteps [1000] nsoftBits1a, nSoftBits1b, nSoftBitsH, nSoftBitsE;
   Word16 *in2, *out2;
   float abMatch, tmpf;
   static int first=1, cnt;
#define ABMATCHING 0.85F
#define INC1A 0.10F
#define USE8PSK 1
   /* Just counters for complexity estimation */
   fwc( );
   if(first){
       cnt=getCounterId("FLO");
       setCounter(cnt)
       Init_WMOPS_counter ( );
       first = 0;
   } setCounter(cnt); Reset_WMOPS_counter( );
   /* To define coding rate ratio between class 1a and 1b */
   abMatch = ABMATCHING;
   i = 0;
   in2 = in;
   out2 = out;
   /* Pointer to puncturing tables /
   punctPtr = tmpPunct;
   // Define the number of bits to be punctured.
   npunct=BitsConvEncoded – BitsPunctured;
   // Define two classes, first for 1a bits and CRC, second for class b and tail.
   n1aAndCRC = nClass1a + nCRC;
   n1bAndTail = nClass1b + nTail;
   // Increase 1a by 10% to safeguard the last bits of that class from the weaker puncturing
   //from class 1b, if not enough bits, then set class1b bits to zero.
   tmp = (int) (n1aAndCRC * INC1A );
   if(tmp> n1bAndTail){
       tmp = n1bAndTail;
   }
   n1aAndCRC = n1aAndCRC + tmp;
   n1bAndTail = n1bAndTail – tmp;
   nPunct1a = –1;
   nPunct1b = –1;
   nSoftBits1a = –1;
   nSoftBits1b = –1;
   while((nPunct1a<0)||(nPunct1b<0)){
       // Then calculate the puncturing needed to get the desired coding rate for
       // classes 1a and 1b.
       // If coding rate cannot be achieved, then iterate until correct rate is found,
       // which is as close as possible to the desired rate.
           nPunct1a = (Word16) ( ( n1aAndCRC * rate * n1bAndTail * ( abMatch – 1.0 ) +
           n1aAndCRC * nPunct) / ( n1aAndCRC + abMatch + n1bAndTail) );
       nPunct1b = nPunct – nPunct1a;
       // Also define the number of possible weak bits for 8-PSK.
           nsoftBits1a = (Word16) ( ( n1aAndCRC * rate * n1bAndTail * ( abMatch – 1.0 ) +
           n1aAndCRC * nSoftBits) / ( n1aAndCRC + abMatch * n1bAndTail) );
       nSoftBits1b = nSoftBits – nSoftBits1a;
       if (nSoftBits == 0) {
           nSoftBits1a = 0;
           nSoftBits1b = 0;
       }
       if(nPunct1a>(n1aAndCRC*(rate–1))){
           fprintf(stderr, "Can not puncture so many bits from Class1a to get the target
rate: %d (%d)\n",
              nPunct1a, nPunct1b);
           exit(–1)
       }
       if(nPunct1b>(n1bAndTail*(rate–1))){
           fprintf(stderr, "Can not puncture so many bits from Class1b to get the target
rate: %d (%d)\n".
              nPunct1a, nPunct1b);
           exit(–1)
       }
       abMatch += 0.01F;
   } // end while
   if(nPunct1a<0){
   fprintf(stderr, "Even without puncturing, Class1a can not reach the target rate: %d \n",
       nPunct1a)
```

Appendix-continued

```
    exit(-1);
;
if(nPunct1b<0) {
    fprintf(stderr, "Even without puncturing, Class1b can not reach the target rate: %d \n",
        nPunct1b);
    exit(-1)
}
// Setting the first bit to be punctured in the start of the trellis.
// The start of the trellis is better protected, so more bits can be punctured.
nHead = nTail − 2;
nDelPolH − rate/2 − 1;
npunctH = oTail − 4 + nDelPolH * nHead;
if(npunct1a<nPunctH)
    nPunctH = nPunct1a−1;
if(nPunctH<0)
    nPunctH = 0;
tmp = nPunctH/nHead;
nDelPolH − tmp;
npunctH = nPunctH − tmp * nHead;
// Also define the weak bits for the start of the trellis.
nSoftBitsH = nTail−1;
if(nSoftBits1a<nSoftBitsH)
    nSoftBitsH = nSoftBits1a;
if(nSoftBitsH > nHead * rate nPunctH − nDelPolH*rate)
    nSoftBitsH = nHead * rate − npunctH − nDelPolH*rate;
for(i=0;i<nPunctH;i++){
    pSteps[i]=1;
}
// Then create puncturing matrix for the start of the trellis.
cGlobalpunctured = punctureStepByStep(in, pSteps, nHead,
    rate, nHead, nPunctH, nDelPolH, tmpPunct, nSoftBitsH);
/* Compensate Head originally belonging to class 1a */
/* and which was processed as a separate instance above. */
npunct1a = nPunct1a − nPunctH − nDelPolH * nHead;
n1aAndCRC = n1aAndCRC − nhead;
nSoftBits1a = nSoftBits1a − nSoftBitsH;
/* Define how many total polynomials have to be punctured and how many bits */
/* are left to partially puncture the last punctured polynomial. */
nDelPol1a = 0;
nStep1a = 0;
tmp = nPunct1a/n1aAndCRC;
nDelPol1a = tmp;
nPunct1a = nPunct1a − tmp * n1aAndCRC;
/* Then define the two puncturing steps to distribute punctured bits evenly */
/* over the partially punctured polynomial. */
if)nPunct1a==0){ // Step once and no puncturing
    nStep1a = 1;
    pSteps[0] = (Word16) n1aAndCRC;
}
else{ // Make sure that at least one bit is punctured from the body if head is punctured
    if((nPunct1a) <= 0){
        pBaseStepL = (Word16) (Word16) n1aAndCRC;
        nBaseL = (Word16) 1;
        pBaseStepH = (Word16)0;
        nBaseH = (Word16)0;
    }
    else{
        pBaseStepL = (Word16) (n1aAndCRC / nPunct1a);
        nBaseL = (Word16) (n1aAndCRC / pBaseStepL);
        if)nBaseL>nPunct1a) nBaseL = nPunct1a;
        pBaseStepH = pBaseStepL + 1;
        nBaseH = (n1aAndCRC) − nBaseL * pBaseStepL;
        nBaseL −= nBaseH;
    }
    // Use dither functions to create list of puncturing steps (psteps)
    nStep1a = dither2Steps(pSteps, nStep1a, nBaseL, nBaseH, pBaseStepL, pBaseStepH);
}
// Then create the puncturing matrix for class 1a.
cGlobalPunctured += punctureStepByStep(&in(rate*nHead], pSteps, n1aAndCRC,
    rate, nStep1a, nPunct1a, nDelPol1a, &tmpPunct[rate*nHead], nsoftBits1a];
// Then start counting for puncturing steps in class 1b.
// Setting the last bit to be punctured in the end of the trellis.
// The end of the trellis is bettor protected, so more hits can be punctured.
nEnd =nTail 0;
nDelPolE = rate/2 − ;
npunctE = nTail − 4 + nDelPolE * nEnd;
if(nPunct1b<npunctE)
    nPunctE = nPunct1b−1;
if(nPunctE<0)
```

Appendix-continued

```
    nPunctE = 0;
tmp = nPunctE/nEnd;
nDelPolE = tmp;
nPunctE = nPunctE - tmp * nEnd;
tmpf = n1bAndTail / (float) nEnd;
// Also define the weak bits for the start of the trellis.
nSoftBitsE = nSoftBits1b /tmpf - 4;
if(nSoftBitsE<0)
    nSoftBitsE = 0;
if (nSoftBits1b<nSoftBitsE)
    nSoftBitsE = nSoftBits1b;
if(nSoftBitsE > nEnd * rate - nPunctE - nDelPolE*rate)
    nSoftBitsE = nEnd * rate - nPunctE - nDelPolE*rate;
/* Compensate end originally belonging to class 1b. */
nPunct1b - nPunct1b - nPunctE - nDelPolE * nEnd;
n1bAndTail = n1bAndTail - nEnd;
nSoftBits1b = nSoftBits1b - nSoftBitsE;
/* Define how many total polynomials have to be punctured and how many bits */
/* are left to partially puncture the last punctured polynomial. */
nStep1b = 0;
nDelPol1b = 0;
tmp = nPunct1b/n1bAndTail;
nDelPol1b = tmp;
nPunct1b = nPunct1b - tmp * n1bAndTail;
/* Then define the two puncturing steps to distribute punctured bits evenly */
/* over the partially punctured polynomial. */
if(nPunct1b==0){ // Step once and no puncturing
    nStep1b = 1;
    pSteps[01] = (Word16) n1bAndTail;
}
else{
    pBaseStepL = (Word16) ((n1bAndTail-nEnd*0) / (nPunct1b-nEnd*0));
    pBaseStepH = pBaseStepL + 1;
    pBaseL = (Word16) ((n1bAndTail-nEnd*0) / pBaseStepL);
    if(nBaseL>(nPunct1b-nEnd*0)) nBaseL = nPunct1b - nEnd*0;
    nBaseH = (n1bAndTail-nEnd*0) - nBaseL * pBaseStepL;
    nBaseL -= nBaseH;
    // Instead of dithering the class 1b, two puncturing steps are not dithered
    // but the bigger step is used at the beginning and the smaller step in the end.
    // So the error protection capability of the beginning will be better
    // but also the bits in the beginning are more important.
#if 1
    tmp = nStep1b;
    for(i=tmp;i<tmp+nBaseH;i++){
        pSteps[i]=pBaseStepH;
        nStep1b++;
    }
    tmp = nStep1b;
    for(i=nStep1b; i<tmp+nBaseL; i++){
        pSteps[i]=pBaseStepL;
        nStep1b++;
    }
#else
    nStep1b = dither2Steps(pSteps, nstep1b, nBaseL, nBaseH, pBaseStepL, pBaseStepH);
#endif
    }
// Then create the puncturing matrix for class 1b.
cGlobalPunctured += punctureStepByStep (&in[(n1aAndCRC+nHead)*rate], pSteps, n1bAndTail,
    rate, nStep1b. nPunct1b, nDelPol1b, &tmpPunct[(n1aAndCRCnHead)*rate], nSoftBits1b);
// Then define stepping table for the end of the trellis.
pSteps[0] - nEnd - nPunctE + 1;
for(i=0;i<nPunctE-1;i+){
    pSteps[1+i]=1;
}
// Then create puncturing matrix for the end of the trellis.
cGlobalPunctured += punctureStepByStep(&in[(n1aAndCRC+nHead + n1bAndTail)*rate],
    psteps, nEnd, rate, nEnd, nPunctE, nDelPolE,
    &tmpPunct[(n1aAndCRC+nHead + n1bAndTail)*rate], nsoftBitsE);
#ifdef DPUN
    fprintf(stderr, "\n");
    for(i=0;i<BitsConvEncoded;i++){
        fprintf(stderr, "%ld", tmpPunct[i]);
        if(i%rate==(rate-1))fprintf(stderr," ");
        if(i%(20*rate)==(20*rate-1))fprintf(stderr,"\n");
    }
    fprintf(stderr,"\n");
    exit(-1);
#endif
    if(cGlobalPunctured!-PitsConvEncoded-BitsPunctured){
```

Appendix-continued

```
        fprintf(stderr, "Puncturing mismatch: Punctured %d, should have been %d\n",
            cGlobalPunctured, BitsconvEncoded BitsPunctured)
        exit(-1)
    }
    test( );
    fwc( )
    WMOPS_output (0);
    // In this version, use normal puncturing routine to do puncturing
    // according to the generated matrix.
    FIX_EDGE_Puncture(in2, BitsPunctured, BitsConvEncoded, tmpPunct,
        out2)
}
```

What is claimed is:

1. A method for channel encoding data bits for transmission via a wireless communication channel a frame at a time, the method comprising:

receiving a each frame consisting of a predetermined number of the data bits, the data bits arranged in order from a beginning to an end of the frame according to subjective importance and grouped into a plurality of predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, defining dithering for the first class $C_A$ and determining whether dithering is to be applied for all other classes $C_B, \ldots, C_Z$ including the last class $C_{last}$;

encoding the data bits of each frame;

determining how many bits to puncture in each protection class so as to achieve the predetermined desired level of error protection for the protection class or, if the desired level of error protection for each class cannot be achieved, then the highest achievable level of error protection closest to the desired level of error protection; and identifying which bits to puncture for each class so as to provide uniform protection for all bits in the first class $C_A$, and so as to provide protection for bits in each other class $C_B, \ldots, C_Z$ that decreases in the same manner as the subjective importance decreases in the class to the end of the class, and for then providing information indicating which bits to puncture and in which order to puncture the bits.

2. The method of claim 1, wherein each class $C_A, C_B, \ldots, C_Z$ includes bits provided by one or more respective generator polynomials each of which provides bits of different importance in respect to error protection and so each of the generator polynomials for the class is more or less important than others of the generator polynomials of the class, and wherein identifying which bits to puncture for each class includes selecting at least some bits originating from the less important generator polynomials for puncturing out before bits originating from the more important generator polynomials.

3. The method of claim 1, further comprising:

resizing the predetermined first two classes so as to enlarge the first class by a number of bits, and to decrease the second class by the same number of bits.

4. The method of claim 1, further comprising:

determining how many weak bits to allocate to each class $C_A, C_B, \ldots, C_Z$ so as to maintain the predetermined desired level of error protection; and identifying which weak bits to allocate to each class $C_A, C_B, \ldots, C_Z$ so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

5. The method of claim 1, further comprising either constructing a puncturing table and performing the puncturing using the puncturing table, or performing the puncturing without using a puncturing table.

6. The method of claim 1, further comprising inverse puncturing, responsive to information indicating which bits to puncture and in what order.

7. A method, as in claim 1, wherein the predetermined desired level of error protection for a class $C_i$, is expressible as a ratio $R_i$, given by:

$$R_i = \frac{N_{C_i}}{\frac{N_{C_i}}{R} - N_{punctC_i}}$$

in which $N_{C_i}$ is the number of bits in class $C_i$, $N_{punctC_i}$ is the number of bits to be punctured from class $C_i$, and R is the coding rate of the convolutional code.

8. A method as in claim 7, wherein the bits in each class are ordered from most important to less important, and $N_{C_i}$ is the number of bits in class $C_i$ after a resizing operation to adjust an original number of bits in the class $C_i$ and also the other classes so as to compensate for weakened protection for the bits following the most important bits in the first class.

9. An apparatus for channel encoding data bits for transmission via a wireless communication channel a frame at a time, wherein each frame consists of a predetermined number of the data bits, the data bits arranged in order from a beginning to an end of the frame according to subjective importance and grouped into a plurality of predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, the apparatus comprising:

means for defining dithering for the first class $C_A$ and determining whether dithering is to be applied for all other classes $C_B, \ldots, C_Z$ including the last class $C_{last}$;

means for encoding the data bits of each frame;

means for determining how many bits to puncture in each protection class so as to achieve either the predetermined desired level of error protection for the protection class or if the desired level of error protection for each class cannot be achieved, then the highest achievable level of error protection closest to the desired level of error protection; and means for identifying which bits to puncture for each class so as to provide relatively strong and uniform protection for all bits in the first class $C_A$, and so as to provide relatively weak protection for bits in each other class $C_B, \ldots, C_Z$ wherein the protection decreases in the same manner as the subjective importance decreases in the class.

10. The apparatus of claim 9, wherein each class $C_A$, $C_B, \ldots, C_Z$ includes bits provided by one or more respective generator polynomials each of which provides bits of different importance in respect to error protection and so each of the generator polynomials for the class is more or less important than others of the generator polynomials of the class, and wherein identifying which bits to puncture for each class includes selecting at least some bits originating from the less important generator polynomials for puncturing out before bits originating from the more important generator polynomials.

11. The apparatus of claim 9, further comprising:
means for resizing the predetermined first two classes so as to enlarge the first class by a number of bits approximately equal to 10% of the size of the first class, and to decrease the second class by the same number of bits.

12. The apparatus of claim 9, further comprising:
means for determining how many weak bits to allocate to each class $C_A, C_B, \ldots, C_Z$ so as to maintain the predetermined desired level of error protection; and
means for identifying which weak bits to allocate to each class $C_A, C_B, \ldots, C_Z$ so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

13. The apparatus of claim 9, further comprising means for either constructing a puncturing table and performing the puncturing using the puncturing table, or for performing the puncturing without using a puncturing table.

14. The apparatus of claim 9, further comprising inverse puncturing means, responsive to information indicating which bits to puncture and in what order.

15. An apparatus as in claim 9, wherein the predetermined desired level of error protection for a class $C_i$ is expressible as a ratio $R_i$, given by:

$$R_i = \frac{N_{C_i}}{\frac{N_{C_i}}{R} - N_{punctC_i}}$$

in which $N_{C_i}$ is the number of bits in class $C_i$, $N_{punctC_i}$ is the number of bits to be punctured from class $C_i$, and R is the coding rate of the convolutional code.

16. An apparatus as in claim 15, wherein the bits in each class are ordered from most important to less important, and $N_{C_i}$ is the number of bits in class $C_i$ after a resizing operation to adjust an original number of bits in the class $C_i$ and also the other classes so as to compensate for weakened protection for the bits following the most important bits in the first class.

17. A system, for channel encoding data bits for transmission via a wireless communication channel a frame at a time, wherein each frame consists of a predetermined number of the data bits, the data bits arranged in order from a beginning to an end of the frame according to subjective importance and grouped into a plurality of predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, comprising:

a channel encoder, comprising:
a dithering module configured to define dithering for the first class $C_A$ and determining whether dithering is to be applied for all other classes $C_B, \ldots, C_Z$ including the last class $C_{last}$;
an encoder module configured to encode the data bits of each frame; and
a puncturing and weak bit allocation module configured to determine how many bits to puncture in each protection class so as to achieve the predetermined desired level of error protection for the protection class or if the desired level of error protection for each class cannot be achieved, then the highest achievable level of error protection closest to the desired level of error protection, and further configured to identify which bits to puncture for each class so as to provide relatively strong and uniform protection for all bits in the first class $C_A$, and so as to provide protection for bits in each other class $C_B, \ldots, C_Z$ protection that decreases in the same manner as the subjective importance decreases in the class; and
a channel decoder, responsive to the transmitter side symbol waveforms as modified by a communication channel, including means for undoing any puncturing performed on bits conveyed by the transmitter side symbol waveforms.

18. An apparatus for channel encoding data bits for transmission via a wireless communication channel a frame at a time, wherein each frame consists of a predetermined number of the data bits, the data bits arranged in order from a beginning to an end of the frame according to subjective importance and grouped into a plurality of predetermined different protection classes including a first class $C_A$ and one or more other classes $C_B, \ldots, C_Z$ including a last class $C_{last}$, the different protection classes having predetermined different desired levels of error protection, the first class $C_A$ having the strongest predetermined desired level of error protection, the apparatus comprising:

a dithering module configured to define dithering for the first class $C_A$ and determining whether dithering is to be applied for all other classes $C_B, \ldots, C_Z$ including the last class $C_{last}$;
an encoder module configured to encode the data bits of each frame; and
a puncturing and weak bit allocation module configured to determine how many bits to puncture in each protection class so as to achieve the predetermined desired level of error protection for the protection class or if the desired level of error protection for each class cannot be achieved, then the highest achievable level of error protection closest to the desired level of error protection, and further configured to identify which bits to puncture for each class so as to provide relatively strong and uniform protection for all bits in the first class $C_A$, and so as to provide protection for bits in each other class $C_B, \ldots, C_Z$ protection that decreases in the same manner as the subjective importance decreases in the class.

19. The apparatus of claim 18, wherein each class $C_A$, $C_B, \ldots, C_Z$ includes bits provided by one or more respective generator polynomials each of which provides bits of different importance in respect to error protection and so each of the generator polynomials for the class is more or less important than others of the generator polynomials of the class, and wherein identifying which bits to puncture for each class includes selecting at least some bits originating from the less important generator polynomials for puncturing out before bits originating from the more important generator polynomials.

20. The apparatus of claim 18, wherein the puncturing and weak bit allocation module is configured to:
resize the predetermined first two classes so as to enlarge the first class by a number of bits approximately equal to 10% of the size of the first class, and to decrease the second class by the same number of bits.

21. The apparatus of claim 18, wherein the puncturing and weak bit allocation module is configured to:
determine how many weak bits to allocate to each class $C_A$, $C_B, \ldots, C_Z$ so as to maintain the predetermined desired level of error protection; and
identify which weak bits to allocate to each class $C_A$, $C_B, \ldots, C_Z$ so as to provide relatively strong and uniform protection for all bits in the first class $C_A$, and so as to provide for each other class $C_B, \ldots, C_Z$ protection that decreases in the same manner as the subjective importance decreases from the beginning of the class to the end of the class.

22. The apparatus of claim 18, wherein the puncturing and weak bit allocation module is configured to either construct a puncturing table and perform the puncturing using the puncturing table, or for perform the puncturing without using a puncturing table.

23. The apparatus of claim 18, further comprising inverse puncturing and weak bit allocation module, responsive to information indicating which bits to puncture and in what order.

24. An apparatus as in claim 18, wherein the predetermined desired level of error protection for a class $C_i$ is expressible as a ratio $R_i$ given by:

$$R_i = \frac{N_{C_i}}{\frac{N_{C_i}}{R} - N_{punctC_i}}$$

in which $N_{C_i}$ is the number of bits in class $C_i$, $N_{punctC_i}$ is the number of bits to be punctured from class $C_i$, and R is the coding rate of the convolutional code.

25. An apparatus as in claim 24, wherein the bits in each class are ordered from most important to less important, and $N_{C_i}$ is the number of bits in class $C_i$ after a resizing operation to adjust an original number of bits in the class $C_i$ and also the other classes so as to compensate for weakened protection for the bits following the most important bits in the first class.

* * * * *

UNITED STATES PATENT AND TRADEMARK OFFICE
CERTIFICATE OF CORRECTION

PATENT NO. : 7,610,543 B2 Page 1 of 1
APPLICATION NO. : 10/443652
DATED : October 27, 2009
INVENTOR(S) : Mikkola et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 729 days.

Signed and Sealed this

Twelfth Day of October, 2010

David J. Kappos
*Director of the United States Patent and Trademark Office*